United States Patent [19]
Lauffenburger

[11] Patent Number: 5,254,957
[45] Date of Patent: Oct. 19, 1993

[54] APPARATUS AND METHOD FOR AMPLIFYING OPTICALLY SENSED SIGNALS

[75] Inventor: James H. Lauffenburger, Colorado Springs, Colo.

[73] Assignee: Information Storage, Inc., Colorado Springs, Colo.

[21] Appl. No.: 814,321

[22] Filed: Dec. 23, 1991

Related U.S. Application Data

[63] Continuation of Ser. No. 732,333, Jul. 17, 1991, abandoned, which is a continuation of Ser. No. 636,022, Jan. 4, 1991, abandoned, which is a continuation of Ser. No. 532,225, Jun. 1, 1990, abandoned, which is a continuation of Ser. No. 437,285, Nov. 16, 1989, abandoned, which is a continuation of Ser. No. 293,300, Jan. 4, 1989, abandoned.

[51] Int. Cl.[5] .............................................. H03F 3/08
[52] U.S. Cl. .................................... 330/308; 330/252
[58] Field of Search ............... 330/59, 69, 124 R, 252, 330/257, 295, 308, 311, 254; 360/67, 68; 250/214 A

[56] References Cited

U.S. PATENT DOCUMENTS

| | | | |
|---|---|---|---|
| 3,748,588 | 7/1973 | Beurrier | 330/295 X |
| 3,769,605 | 10/1973 | Long | 330/69 X |
| 3,955,149 | 5/1976 | Trilling | 330/59 X |
| 4,750,217 | 6/1988 | Smith et al. | 330/308 X |

Primary Examiner—Steven Mottola
Attorney, Agent, or Firm—Merchant, Gould, Smith, Edell, Welter & Schmidt

[57] ABSTRACT

An improved method and circuitry for amplifying and processing detected pairs of input signals, in a manner that provides excellent DC accuracy, wideband signal handling capability and fast overload recovery, are disclosed. The invention is particularly suitable for use as a preamplifier for pairs of sensed photodetector current signals. Common base and emitter coupled circuits are arranged in various configurations to simultaneously process pairs of detected signals to provide normalized analog differential output current signals that can be directly used by amplifier circuits without concern for overloading of the amplifier as a result of severe overload signals detected by the input sensors. The circuitry readily accommodates external real-time gain control.

44 Claims, 4 Drawing Sheets

APPARATUS AND METHOD FOR AMPLIFYING OPTICALLY SENSED SIGNALS

This is a continuation, of application Ser. No. 07/732,333, filed Jul. 17, 1991, which was abandoned upon the filing hereof, which is a continuation-in-part, continuation, division, of application Ser. No. 07/636,022, filed Jan. 4, 1991, which was abandoned upon the filing hereof, which is a continuation, division, of application Ser. No. 07/532,225, filed Jun. 1, 1990, which was abandoned upon the filing thereof, which is a continuation, of application Ser. No. 07/437,285, filed Nov. 16, 1989, which was abandoned upon the filing thereof, which is a continuation of application Ser. No. 07/293,300, filed Jan. 4, 1989, which was abandoned on the filing date thereof.

FIELD OF THE INVENTION

This invention relates generally to electronic amplifiers and more particularly to the design and use of an amplifier circuit particularly suitable for processing signals produced by optical sensors such as the type used in optical recording disk drive systems.

BACKGROUND OF THE INVENTION

Photodetectors and their associated sensing circuits have long been known in the art. It has only been relatively recently, however, with the commercial development of laser technology and new uses therefor, that a need has developed for significantly improving the accuracy and response times for photodetector circuitry. This need is most pronounced in the optical recording technology, often referred to as the digital laser recording art. Such technology, which offers the capability for real-time optical recording of image data in highly compressed format and optoelectronic access to the recorded data, provides a practical alternative and often marked advantages over the traditional magnetic recording technology. The optical recording technology is directly compatible with the principles of digital recording and provides a ready framework for computer based document storage and retrieval and record management systems.

While a number of areas utilizing optical data recording principles have been explored, the technology is still in its early stages of development. Typical of such optical data recording systems in use today are those which use a highly focused laser beam for storing (or "writing") the binary digital information on an optically sensitive or responsive storage media, and a lower-powered highly focused laser beam that scans across the recording medium for "reading" the binary information stored thereon. The typical recording medium in use today is an optical storage disk that rotates relative to the "read" and "write" laser heads which are movably controlled so as to appropriately scan across the disk surface as it rotates.

As will be readily understood by those skilled in the art, the "tracks" upon which "data" is written on a disk may already contain bits of prerecorded synchronization and timing information that dictate in part the manner in which subsequent "data" is written onto the tracks. The laser and associated photodetectors associated with the optical "read" sensors in an optical read-/write head are, therefore, continuously scanning the disk for such synchronization bits of information as the "data" information is being written onto the disk. The optical read sensors must be sensitive to the detection of the fairly low-intensity optical signals from the "read" laser, and typically include preamplifiers and amplifiers for magnifying the detected optical signals to workable signal strengths for use as control signals for the optical disk drive system that they service. In a typical optical disk drive system, when the optical read sensors detect a large power burst from the "write" laser during a write operation, the read sensor amplifiers typically suffer an input overload of ten or more times that for which they are designed when operating to sense the presence of bits recorded on the media, causing the read amplifiers to saturate and to overcharge filtering networks that receive signals from the read amplifiers. Such overload condition causes significant delays in the response time and effectiveness of the read sensor circuitry since all effects of the overload condition must settle before the read circuitry detection process can resume operation in its intended manner. Such settling process wastes valuable time and can result in the read sensor circuitry being ineffective to detect, for example, subsequent bits of timing information as they pass the read sensor head. This problem has not been adequately addressed by prior art optical disk drive amplifier circuit designs. Besides the requirement for fast overload recovery, it is desirable for the photodetector amplifier circuitry to have excellent DC accuracy and wideband signal handling capability (typically 0-100 MHz). Heretofore, the combination of these features has not been found in the art.

The present invention addresses the above design shortcomings heretofore practiced in the art, by providing a simple yet highly effective, reliable and accurate amplifier design for processing detected signals from photodetectors in a manner which prevents amplifier overloading during detection of a "write" signal, and which provides excellent DC accuracy and wideband signal handling capability. Due to the unique manner in which the amplifier circuitry of this invention processes incoming photodetector signals, transistors within the amplifier are not allowed to saturate when an overload input signal is received, and downstream filter networks which have long time constants are not excessively charged during detection of a write signal. These and other features of the invention will become apparent to those skilled in the art upon a more detailed description herein.

SUMMARY OF THE INVENTION

As will become apparent to those skilled in the art, the principles of the invention described herein are most applicable to the processing of input current signals received from a pair of photodetector sensors, and in particular to the implementation of a preamplifier for processing signals from photodetector sensor pairs. For this reason, the preferred embodiment of the invention will be described with reference to an optical sensing head application. It will be understood, however, that the principles of this invention are not to be limited to the processing of signals from photodetector sensors, but can be used in other applications wherein a preamplifier having wideband response, extremely fast overload recovery and excellent DC accuracy are required.

The invention utilizes an analog signal processing technique for processing a pair of received input signals (hereinafter simply referred to as photodetector sensed input signals) by various configurations of common base and emitter coupled transistor networks. According to one aspect of the invention, a method is provided for amplifying pairs of detected input current signals which includes the steps of: (a) receiving a pair of input current signals from two different (photodetector) sensors; (b) simultaneously applying the pair of received input current signals to input terminals of an emitter coupled transistor circuit and a common base transistor circuit; (c) processing the pair of input current signals by the emitter coupled transistor circuit to provide a normalized differential output current signal between first and second output terminals that is proportional to the difference of the received input signals and inversely proportional to their sum; and (d) processing the pair of input current signals by the common base transistor circuit to provide a second output signal equal to the sum of the received input signals. This method of processing the received input signals provides very fast overload recovery (less than or equal to 100 nanoseconds following receipt of an overload condition), wideband response (from about 0 to 100 MHz), and excellent DC accuracy. The method and circuitry used for its implementation is also readily adaptable to integrated circuit fabrication techniques which further enhances the process by enabling the matching of transistors and their temperature response characteristics. The invention includes modification of the above method to include receiving a first (gain) control input current signal and varying the gain of the emitter coupled transistor circuit in response to the received input control signal such that the analog differential output current signal is directly proportional to the received gain control input signal. The method is also readily adaptable to receiving and processing a second input control signal by means of the common base transistor circuitry to provide an output control signal equal to the sum of the received input current signals from the sensors and the second input control signal.

According to another aspect of the invention, there is provided a method of processing received input signals from photodetectors or other sensors, as set forth in the preceding paragraph wherein the sum of the received detected input signals and the second input control signal are simultaneously applied to the input terminals of a second emitter coupled transistor circuit and a second common base transistor circuit. The summed input signal and the second input control signal are processed by the second emitter coupled transistor circuit to provide a second normalized differential output current signal between third and fourth output terminals that is proportional to the sum of the detected current signals minus the second control signal and is inversely proportional to the sum of the detected input current signals and the second control signal. The second common base transistor circuit processes the summed pair of detected input current signals with the second control signal to provide an output signal equal to their collective sum. The gain of the second emitter coupled transistor circuit can also be varied by means of a third input control signal such that the second differential output current signal is directly proportional to the received third input control signal.

According to another aspect of the invention, there is provided a method for amplifying pairs of photodetected input current signals, including the steps of: (a) receiving a pair of input current signals from two different photodetector sensors; (b) processing the pair of received input current signals by means of a first common base transistor circuit to provide a first summation signal equal to the sum of the received input current signals; (c) receiving a first control input signal; (d) simultaneously applying the first summation signal and the first control signal to input terminals of an emitter coupled transistor circuit and to a second common base transistor circuit; (e) processing the first summation signal and the first control signal by the emitter coupled transistor circuit to provide a normalized differential output current signal between first and second output terminals that is proportional to the difference of the first summation signal and the first control signal and inversely proportional to their sum; and (f) processing the first summation signal and the first control signal by the second common base transistor circuit to provide a second summation signal equal to the sum of the first summation signal and the first input control signal. The above method can further be modified to vary the gain of the emitter coupled transistor circuit by means of a second received control input current signal such that the differential output current signal is directly proportional to the second input control signal.

The invention further includes circuit means operatively connected in a manner so as to practice the methods outlined above and as set forth in more detail below in a description of the invention as applied to a preferred embodiment application, and as specifically set forth in the appended claims. While the invention will be described in association with a preferred embodiment application thereof that is configured to mount upon and move with a movable optical head sensor, it will be understood by those skilled in the art that the inventive circuitry can be used with any type of photodetector sensor apparatus, whether fixed or movable. Further, while the preferred embodiment of the invention will be described as implemented in integrated circuit configuration, it will readily be understood by those skilled in the art that the inventive methods and circuits used for implementing those methods can also be implemented by other techniques as, for example, using discrete components or hybrid circuitry. Those skilled in the art will further appreciate that while particular current mirror circuits are illustrated to provide various current source and regulation functions in the preferred embodiment description, that other circuit configurations could also be employed to perform the current source and regulatory functions. As previously explained, while the invention will be described with reference to its use in processing photodetector sensed signals, the invention is not limited to the processing of photodetector signals or to the particular circuit networks described with reference to the preferred embodiment implementation. Such description is intended to merely illustrate one specific embodiment to which the principles of this invention apply. Numerous other embodiments and variations and applications of the principles of the invention will become apparent to those skilled in the art, in light of the following description of a preferred embodiment of this invention.

BRIEF DESCRIPTION OF THE DRAWING

Referring to the Drawing, wherein like numerals represent like parts throughout the several views.

DETAILED DESCRIPTION OF THE INVENTION

The invention includes an amplifier, and more properly a preamplifier, for processing sensed signals developed by a photodetector. The circuit method and configurations of this invention are particularly well suited for processing photodetector signals in optical disk drive systems, (either of the WORM or erasable types). It will be understood by those skilled in the art, however, that the invention could be applied to other amplifier applications requiring excellent DC accuracy, wideband signal handling, very fast overload recovery and automatic, wideband, large signal normalized gain. In the preferred implementation of the invention, the preamplifier is configured as an integrated circuit chip and finds particular applicability as a preamplifier in, for example, a Type 525GB WORM optical disk drive system.

In practice, the "preamplifier" circuitry disclosed with respect to the preferred embodiment is generally physically placed upon the movable Optical Head portion of an optical disk drive system. Such application is functionally illustrated in FIG. 10. Referring thereto, the Optical Head unit is generally designated at 70. The Optical Head would typically include at least one laser (not illustrated) suitable for performing the "write" and "read" functions as selectively energized by drive circuitry described below. The Optical Head also includes one or more sets of photodetector sensors (not illustrated) which provide the input signals to, for example, the Ia, Ib and the Ja, Jb input signals (hereinafter described) of a Preamplifier such as that disclosed with respect to the present invention. The Preamplifier of the type to which this invention pertains is illustrated at 20 in FIG. 10 as forming a part of the Optical Head 70 and being movable therewith. Due to the size constraints imposed upon the Optical Head and the fact that it is a movable part whose movement control requires a high degree of accuracy, it is desirable to keep the Preamplifier circuitry simple and to match the circuits therein as close as possible. Accordingly, in the preferred embodiment, the Preamplifier 20 is constructed as an integrated circuit from the photodetectors. Yet another reason for placing the Preamplifier directly adjacent the photodetector diodes is to minimize extraneous signals that could alter the detected signals. Another advantage of incorporating the Preamplifier circuitry into a single integrated circuit chip is that all of the circuit components forming a part thereof experience the same temperature variations, and therefore, more closely track one another.

Figure 10:
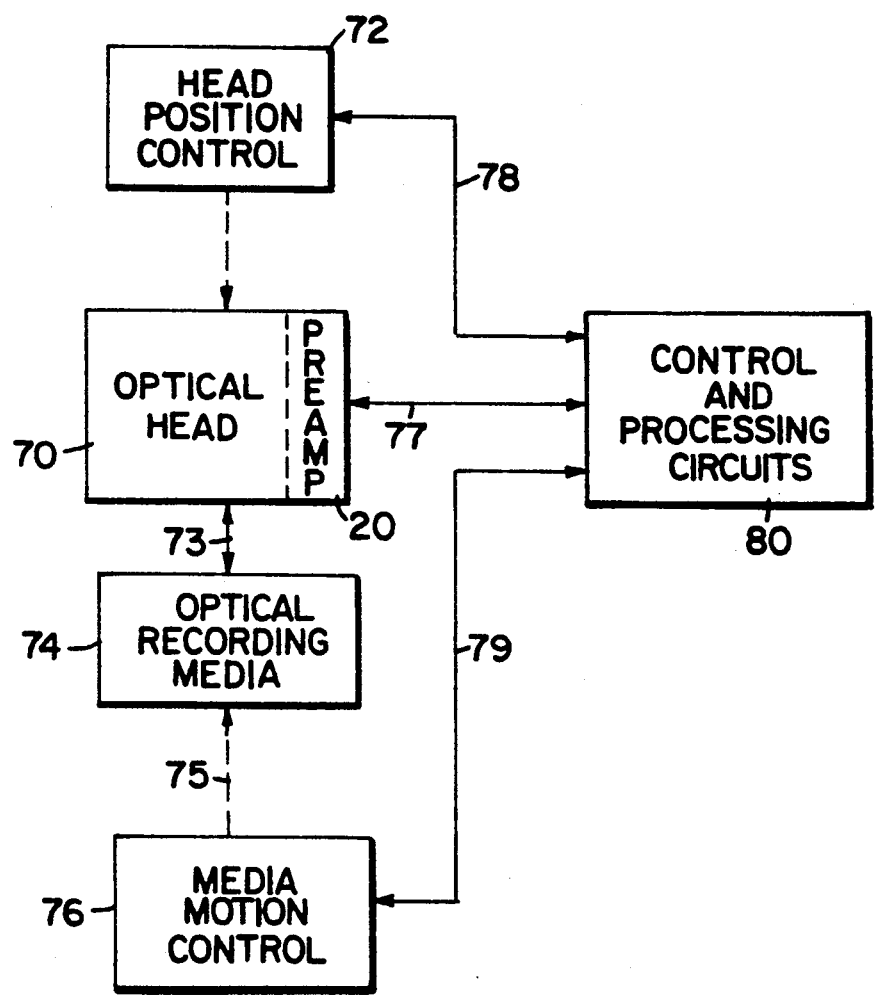
FIG. 10 is a diagrammatic block diagram illustrating use of a preamplifier configured according to the principles of this invention within a typical optical disk drive system.

To complete the general environment in which the Preamplifier 20 operates, the Optical Head 70 generally has a Head Position Control mechanism, generally illustrated at 72, which mechanically controls the physical positioning of the Optical Head members 70 as indicated by the dashed arrow 71. The Optical Head 70 is operatively moved by the Head Position Control 72 so as to read and write information from and on to an appropriate Optical Recording Media 74 which, in the preferred embodiment, is an optical storage disk. The transfer of information between the Optical Head 70 and the Optical Recording Media 74 is generally illustrated in FIG. 10 by the signal flow path 73. Movement of the Optical Recording Media 74 (such as, rotation of an optical disk) is provided by means of an appropriate Media Motion Control unit generally designated at 76, which is operatively connected to move the Recording Media as indicated by the dashed line 75. The functional blocks broadly described with respect to FIG. 10 will not be described in any detail, since those skilled in the art of optical disk drive systems will readily appreciate the details of such systems in which the Preamplifier 20 is designed to operate.

A Control and Processing Circuit functional block, generally designated at 80, generally includes all of that control circuitry used for reading and writing information from and on to the Optical Recording Media 74 by controlling the laser(s) within the Optical Head 70, and by cooperatively controlling movement of the Optical Head 70 through the Head Position Control unit 72 and of the Optical Recording Media 74 through the Media Motion Control 76. The Control and Processing Circuits generally include the primary amplifier and filtering networks serviced by the Preamplifier 20. Such circuits communicate with the Preamplifier 20 by means of the signal flow path 77. The Optical Head 70 is generally connected with the Control and Processing Circuits 80 by means of a flexible cable arrangement. The Control Circuits 80 communicate with the Head Position Control function 72 by means of the signal flow path 78 and with the Media Motion Control function 76 by means of the signal flow path 79.

As will be appreciated by those skilled in the art, since it is desirable to minimize hardware components on the Optical Head 70, most of the larger filtering capacitors and networks requiring capacitors and timing circuits are located within the Control and Processing Circuit network 80. As will be appreciated from a more detailed description of the invention, an advantage of the Preamplifier 20 of the present invention is that it does not require any capacitors or filter networks for its operation or to be placed upon the Optical Head 70. Further, due to the unique nature in which it generates the differential output current signals from the sensed photodetector input signals, those filtering and other networks having capacitors that are sensitive to overload charging conditions which are located within the Control and Processing Circuits 80 are generally not affected by sensed input overload condition since the Preamplifier 20 effectively eliminates transmission of sensed overload conditions to the filter networks within the Control Circuits 80.

The following description of a preferred embodiment of the invention will describe the invention in its application as a preamplifier circuit in integrated circuit configuration. Further, the preamplifier will be described in its preferred use as a preamplifier for use in a WORM optical disk drive system. Those skilled in the art will readily appreciate how the principles of this invention can be extended to include circuits of other configurations and applications having, for example, different inputs and outputs as required by the application to which the circuit will be put.

Figure 1:
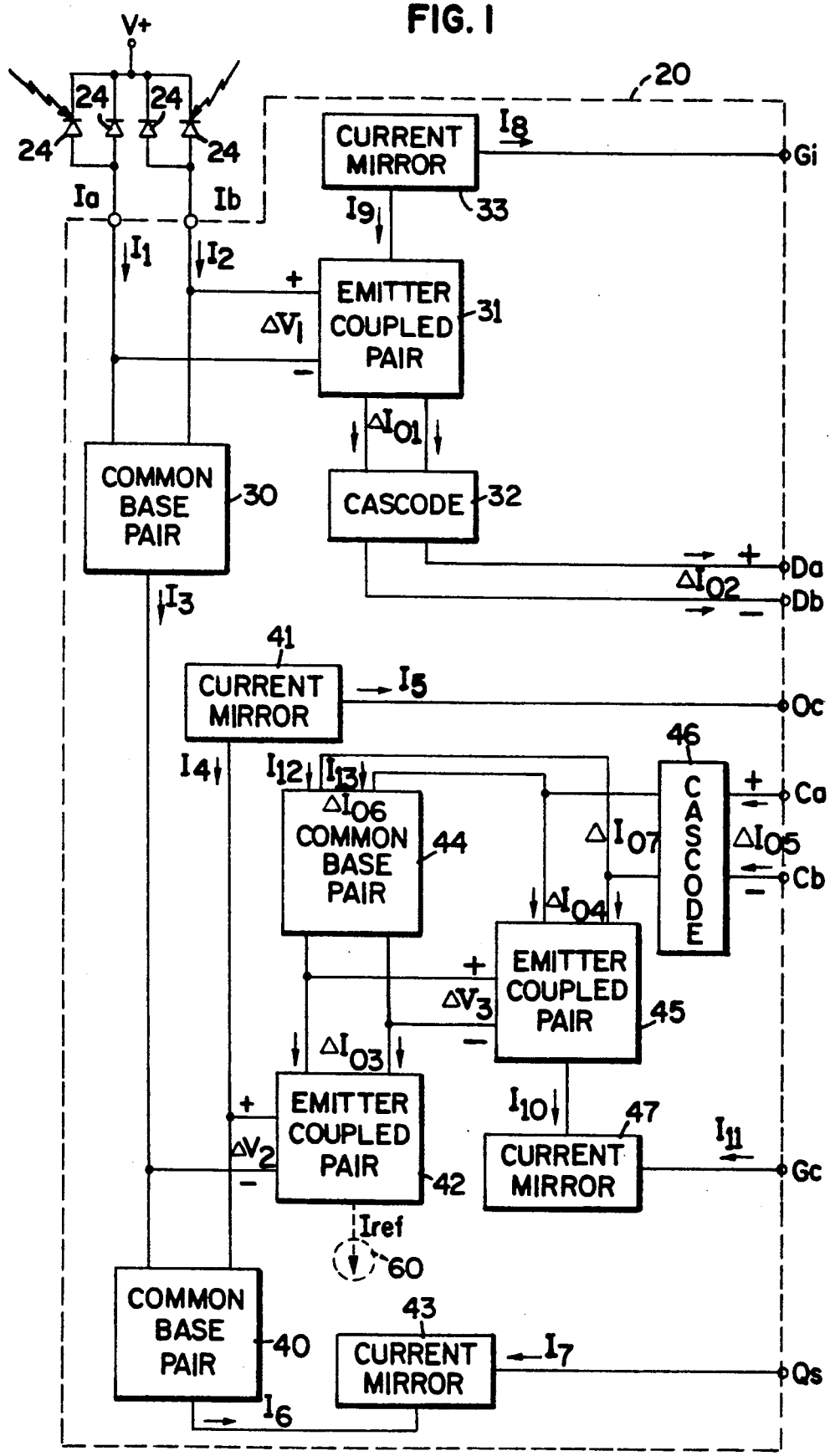
FIG. 1 is a diagrammatic block diagram illustrating the primary differential and common mode signal generation portions of a preamplifier design configured according to the principles of this invention and operable in response to a single pair of sensed input current signals.
Figure 2:
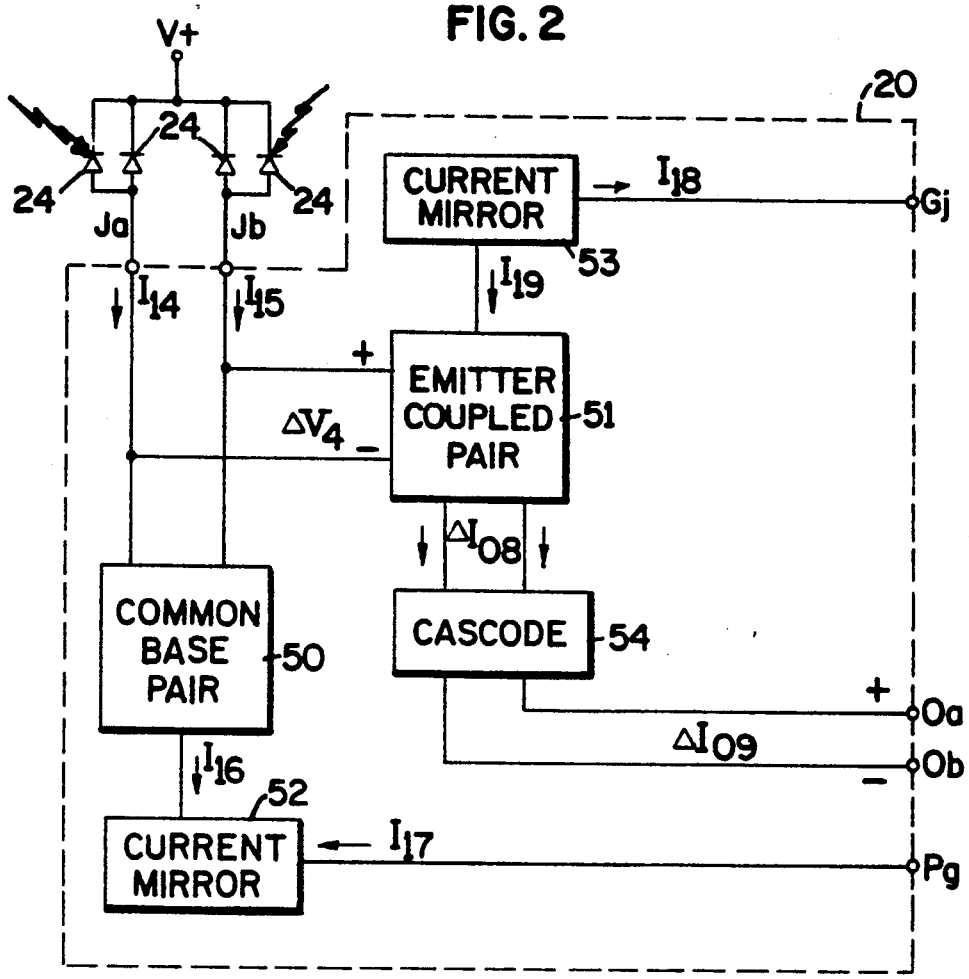
FIG. 2 is a diagrammatic block diagram illustrating a supplemental portion of the amplifier of FIG. 1, which provides a third differential output in response to a second pair of sensed input current signals, for use in those systems using two pairs of photodetector sensed input conditions.

The integrated circuit configuration of the preferred embodiment is illustrated in FIGS. 1 and 2 by basic functional circuit blocks which collectively comprise the primary functions of the preamplifier chip circuit. Those portions of the amplifier network that are included within the integrated circuit are collectively illustrated within the dashed lines 20. In the preferred embodiment, the integrated circuit contains two pairs of current inputs for receiving input current signals from two different photodetector sensors, designated respectively at Ia, Ib (FIG. 1) and Ja, Jb (FIG. 2). The photodiodes associated with the input terminals Ia and Ib are generally illustrated in FIG. 1 at 22, and are appropriately connected to a voltage source (V+) as well-known in the art. The photodiodes may, for example, represent the "read" sensor elements of an optical read/write head, and could represent, for example, dual or quad photodiode configurations. The photodiodes associated with the input terminals Ja, Jb on FIG. 2 are generally illustrated at 24 and could also represent dual or quad photodiode configurations. While generally not illustrated or described herein, it will be understood that the various electrical circuits described herein include appropriate connections to biasing and reference supplies and to current source circuits, where appropriate. Those skilled in the art of circuit design will readily appreciate the nature of and extent to which such connections would be required.

The amplifier network 20 further has four control input terminals designated in FIG. 1 and FIG. 2 as Gi, Oc, Gc and Gj. In the preferred application of the amplifier network 20, the Gi control input terminal is connected to receive a "focus gain" control signal; the Oc control input terminal is connected to receive a "channel offset" control signal; the Gc control input terminal is connected to receive a "channel gain" control signal; and the Gj input control terminal is connected to receive a "position gain" control signal. Those skilled in the art of optical disk drives will readily appreciate the significance and use of such control signals in an optical disk drive system. From a general circuit viewpoint, however, these four control input terminals could be employed to receive control signals having other designations but which function in a manner similar to that described below with respect to the preferred embodiment use of the preamplifier circuit.

The amplifier network 20 has three pairs of differential current output terminals indicated in FIGS. 1 and 2 as Da, Db; Ca, Cb; and Oa, Ob. In the preferred embodiment application of the circuit, the Da, Db differential output terminals represent the main differential output of the preamplifier and provide the disk drive system with a "Focus Error signal." The Ca, Cb differential output signal represents the main common mode output signal of the preamplifier and provides an "RF control signal" to the disk drive system. The Oa, Ob differential output signal represents, in the preferred embodiment, a supplementary channel output pair that acts much the same as the "Focus Error signal" and can be used for such functions as providing a "Position Error signal" to a transducer, if present, on the optical head or for providing a "Focus Error signal" for those systems which use separate photodetector input sensors for this function.

The preferred embodiment amplifier circuit as illustrated in FIGS. 1 and 2 has two other special purpose output ports designated as Qs which represents the primary channel sum, and Ps which represents the supplementary channel sum (to be described in more detail hereinafter).

Referring to FIG. 1, the input terminals Ia and Ib are respectively connected to provide sensed input current from the photodetector sensors to the emitters of a pnp Common Base Pair of transistors 30 and to the bases of a pnp Emitter Coupled Pair of transistors 31. The collectors of the Emitter Coupled Pair of transistors 31 are respectively connected to the emitters of a pair of pnp Cascode transistors 32, the collectors of which are directly connected to the (+) Da and (−) Db Focus Error differential output terminals respectively. The commonly connected emitters of the pnp Emitter Coupled Pair 31 are connected to the current input terminal (FIG. 9) of a Widlar pnp Current Mirror circuit 33, whose current output terminal is directly connected to the Gi Focus Gain input control terminal of the integrated circuit. The Current Mirror 33 provides a part of the current source circuitry for the Emitter Coupled Pair 31. In general, the current mirror circuits described herein provide current regulation to the functional blocks to which they are connected, as will be readily understood by those skilled in the art.

The commonly connected collectors of the pnp Common Base Pair 30 are connected to provide an input current signal to one of the emitters of a pnp Common Base Pair of transistors 40. The other emitter of the Common Base Pair of transistors 40 is directly connected to the current input terminal of a basic pnp Current Mirror circuit 41 (see FIG. 7). The current output terminal of the Current Mirror circuit 41 is directly connected to the Channel Offset input control terminal Oc. The current input terminal of the Current Mirror network 41 is also connected to the (+) base input of an npn Emitter Coupled Pair of transistors 42. The (−) base input of the Emitter Coupled Pair 42 is directly connected to receive the current output signal from the collectors of the Common Base Pair 30. The commonly connected emitters (FIG. 6) of the Emitter Coupled Pair 42 are operatively connected to an appropriate current source, generally illustrated at 60 in a manner well-known to those skilled in the art. The output current signal from the Common Base Pair 40 is connected to drive the input terminal of a Widlar npn Current Mirror circuit 43. The current output terminal of the Current Mirror circuit 43 is directly connected to the Qs primary output summing terminal.

The collectors of the npn Emitter Coupled Pair of transistors 42 are connected respectively to the emitters of the npn Common Base Pair of transistors 44, and are also respectively directly connected to the bases of the npn Emitter Coupled Pair of transistors 45. The collectors of the Emitter Coupled Pair of transistors 45 are connected by means of npn Cascode-connected transistors 46 respectively to the (+) Ca and (−) Cb RF differential output signal terminals and are also respectively connected to the emitters of the npn Common Base Pair 44. The commonly connected emitters of the Emitter Coupled Pair 45 are connected to supply the input current signal to a Widlar npn Current Mirror circuit 47. The current output terminal of the Current Mirror 47 is connected to receive a control signal from the Gc Channel Gain control input terminal.

Referring to FIG. 2, the sensed photodetector current input signals received at input terminals Ja and Jb are directly applied to the emitters of a pnp Common Base Pair of transistors 50, and are also directly applied to the bases of a pnp Emitter Coupled Pair of transistors 51. The commonly connected collectors of the Common Base Pair 50 are connected to provide a current input signal to a Widlar npn Current Mirror circuit 52. The signal output from the Current Mirror circuit 52 is directly connected to the Ps supplemental channel summing output terminal. The commonly connected emitters of the Emitter Coupled Pair of transistors 51 are connected to provide an input current signal for the Widlar pnp Current Mirror circuit 53. The current output terminal of the Current Mirror circuit 53 is directly connected to receive a control signal from the Position Gain Gj input control terminal. The collectors of the Emitter Coupled Pair of transistors 51 are respectively connected by means of pnp Cascode connected transistors 54 respectively to the (+) Oa and (−) Ob Focus or Position Error differential output terminals.

Figure 3:
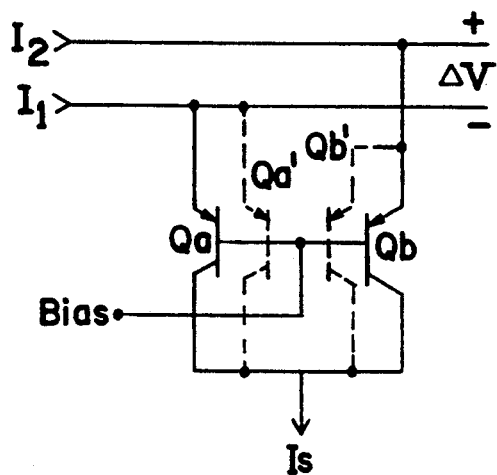
FIG. 3 is a schematic diagram of the pnp common base pair circuit portion of the amplifier illustrated in FIGS. 1 and 2.

The transistor configurations for the circuit blocks illustrated in FIGS. 1 and 2 are well-known in the art. However, for the sake of clarity and in order to avoid any confusion as to their respective configurations, the various circuit configurations represented by the functional blocks of FIGS. 1 and 2 are illustrated in more detail, but without detailed description of their well-known operation, in FIGS. 3-9. The basic schematic diagram of the pnp Common Base transistor pair circuits 30, 40 and 50 is illustrated in more detail in FIG. 3. Referring thereto, it will be noted that the emitters of the pnp common base-connected pair of transistors Qa and Qb are connected to receive the input current signals I1 and I2 respectively. The bases of transistors Qa and Qb are connected in common to an appropriate "bias" potential, and the collectors of the transistors are also connected in common to form the output current signal Is of the circuit. As illustrated in FIG. 3, additional transistors Qa' and Qb' may be connected in parallel with their respective primary transistors Qa and Qb to provide additional current handling capability. This technique is well-known in the art and is typically employed when such circuits are required to handle larger input current levels. It will be understood hereinafter that the parallel transistor principles such as illustrated in FIG. 3 can equally well be used on other "common terminal" transistor configurations, while not specifically illustrated further herein.

Figure 4:
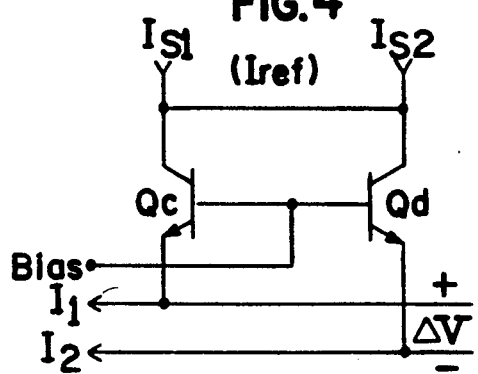
FIG. 4 is a schematic diagram of the npn common base pair circuit portion of the amplifier illustrated in FIG. 1.

The npn Common Base Pair transistor configuration of circuit 44 is illustrated in more detail in FIG. 4. Referring thereto, it will be noted that the input current signals generally designated as I1 and I2 are respectively commonly applied to the emitters of transistors Qc and Qd. The bases of transistors Qc and Qd are commonly connected to a bias potential and their collectors are respectively connected to receive a pair of input source current signals Is and Is2.

Figure 5:
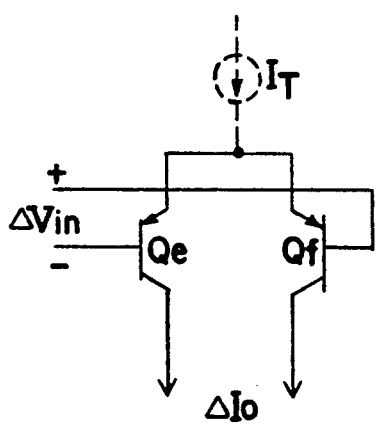
FIG. 5 is a schematic diagram of the pnp emitter coupled pair circuit portion of the amplifier illustrated in FIGS. 1 and 2.

The standard configuration for a pnp Emitter Coupled Pair circuit such as depicted in circuit blocks 31 and 51 of FIGS. 1 and 2 is schematically illustrated in FIG. 5. The transistor pair Qe and Qf have their emitters commonly connected to receive a constant current supply generally illustrated at $I_T$. The differential current output signal appearing at the collectors of transistors Qe and Qf is proportional to the differential voltage input applied to their respective emitters.

Figure 6:
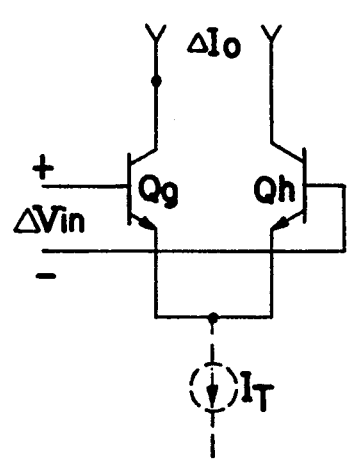
FIG. 6 is a schematic diagram of the npn emitter coupled pair circuit portion of the amplifier illustrated in FIG. 1.

The schematic diagram of the npn Emitter Coupled Pair of transistors 42 and 45 is illustrated in FIG. 6. The FIG. 6 circuit is similar in configuration to that of Fig. 5 except for the direction of current flow through the transistors.

Figure 7:
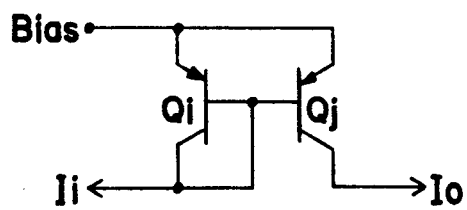
FIG. 7 is a schematic diagram of the basic pnp current mirror circuit portion of the amplifier illustrated in FIG. 1.

The schematic circuit configuration for the basic pnp Current Mirror circuit 41 of FIG. 1 is illustrated in more detail in FIG. 7. The bases of the pnp transistors Qi and Qj are commonly connected with the collector of transistor Qi to receive the input current signal Ii. The emitters of transistors of Qi and Qj are also commonly connected to an appropriate "bias" potential. The collector of transistor Qj provides the output current signal for the Current Mirror circuit.

Figure 8:
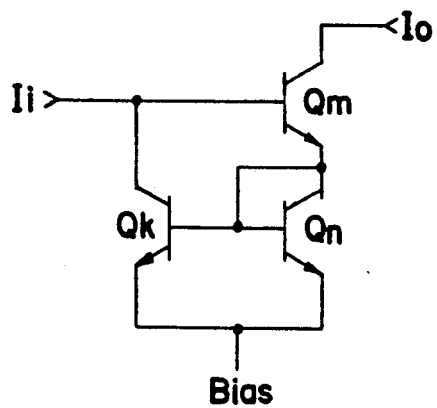
FIG. 8 is a schematic diagram of the Widlar npn current mirror circuit portion of the amplifier illustrated in FIGS. 1 and 2.

The schematic diagram configuration of the Current Mirror circuits 43, 47 and 52 of FIGS. 1 and 2 is illustrated in FIG. 8. This circuit configuration is typically referred to as a Widlar npn current mirror configuration. Current input (Ii) to the circuit is applied to the collector of an npn transistor Qk and to the base of a second npn transistor Qm. The emitter of transistor Qm is directly connected to the collector of a third npn transistor Qn and in common to the bases of transistors of Qk and Qn. The emitters of transistors Qk and Qn are commonly connected to an appropriate bias potential. The collector of transistor Qm provides the output current signal for the Current Mirror circuit, as is well-known in the art.

Figure 9:
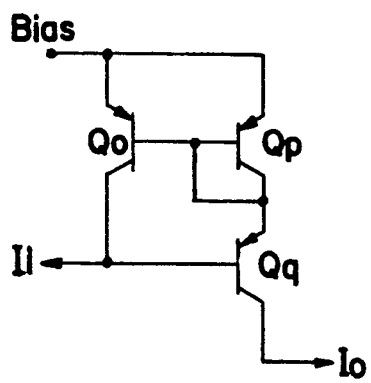
FIG. 9 is a schematic diagram of the Widlar pnp current mirror circuit portion of the amplifier illustrated in FIGS. 1 and 2.

The pnp version of the Widlar current mirror circuits 33 and 53 is schematically illustrated in FIG. 9. Referring to FIG. 9, the pnp transistors Qo, Qq and Qp provide the counterpart functions for the npn transistors Qk, Qn and Qm of the npn Current Mirror circuit previously described with respect to FIG. 8. As is well-known to those skilled in the art, current mirror circuits such as those illustrated in FIGS. 7, 8 and 9 are operable such that the output current (Io) mirrors input current signal (Ii).

A description of the operation of the circuits of FIGS. 1 and 2 can readily be developed with reference thereto and to the supporting schematic diagrams of the functional blocks thereof (i.e., FIGS. 3-9). In developing the below equations, the assumption is being made that only large-signal considerations are relevant and that the equations apply only to wideband situations. No small-signal approximation of the various transistors need be considered. The equations developed are generally valid up to the natural rolloff frequency of the transistors and down to DC. Further, they are valid from photodetector signals ranging down to femtoamps up to milliamps, as limited by the current handling and second-order effects of the transistor. With respect to the transistors themselves, the assumption is made that the transistors are at the same temperature, are virtually identical in paired configurations and are of high quality (i.e., beta is much greater than one, and alpha is approximately equal to one). When the circuits are configured in an integrated circuit, a typical fabrication process will provide a transistor having a worst case transition frequency of 1 GHz with a typical gain of 10, providing a fundamental circuit bandwidth limit on the order of 100 MHz. It will be understood that those skilled in the art are fully knowledgeable with the equations relating to transistors, which will not be detailed herein. Rather, a development only of the input and output signals to the various circuit components illustrated in FIGS. 1 and 2 will be provided to illustrate how the differential output current signals are derived.

Referring to FIGS. 1 and 2, the current signal, designated as I3 produced by the Common Base Pair 30 generally equals the sum of the current signals I1 and I2 received at the input terminals Ia and Ib respectively, as shown in Equation 1.

Equation 1:
$$I_3 = I_1 + I_2$$

The differential voltage $\Delta V1$ applied to the (+) and (−) input terminals of the Emitter Coupled Pair 31 is represented by Equation 2.

Equation 2:
$$\Delta V_1 = V_T \ln(I_1/I_2)$$

The signal appearing at the Oc (i.e., channel offset) control signal input terminal is represented as I5, which by reason of the Current Mirror 41 is the same as I4, as shown in Equation 3.

Equation 3:
$$Oc \text{ (Channel Offset Control Signal)} = I_5 = I_4$$

The output current I6 produced by the Common Base Pair 40 will be of the sum of its input currents I3 and I4 as shown in Equation 4.

Equation 4:
$$I_6 = I_3 + I_4$$

The Current Mirror circuit 43, mirrors the current signal appearing at the output of the Common Base Pair 40 at the Qs summing output terminal, which equals the sum of the input currents applied to the input terminals Ia and Ib plus the control signal applied to the channel offset input terminal Oc (see Equations 5 and 6).

Equation 5:
$$I_7 = I_6$$

Equation 6:
$$Qs \text{ (Quad Sum)} = I_7 = Ia + Ib + Oc \text{ (Terminal Currents)}$$

The current signal applied at the Gi (Focus Gain) input control terminal is designated as I8, and will be the mirror image of the input current signal I9 of the Current Mirror network 33.

Equation 7:
$$Gi \text{ (Focus Gain Control Signal)} = I_8 = I_9$$

The differential current output signal from the Emitter Coupled Pair 31 is represented by Equation 8.

Equation 8:
$$\Delta I_{O1} = I_9 \frac{I_1 - I_2}{I_1 + I_2}$$

The differential current output signal ($\Delta I02$) provided to the (+) Da and (−) Db Focus Error differential output terminals is represented by Equations 10 and 11, wherein Equation 11 represents the differential current output signal in terms of the input current signals received from the photodetector circuits.

Equation 9:
$$\Delta I_{O2} = K_1 \Delta I_{O1}$$

Equation 10:
$$Da - Db \text{(Differential Current Output)} = \Delta I_{O2} = K_1 G_i \frac{Ia - Ib}{Ia + Ib}$$

It will be appreciated by those skilled in the art that the single Emitter Coupled Pair functional block illustrated at 31 in FIG. 1 could represent one or many emitter coupled transistor pairs operatively connected in cascaded configuration to provide the same function as illustrated by the above equations.

The differential input voltage applied to the Emitter Coupled Pair 42 is set forth in Equation 11, and the differential current signal from the Emitter Coupled Pair 42 is provided in Equation 12, wherein the final portion of the equation is drafted in terms of input and output terminal signal notations.

Equation 11:
$$\Delta V_2 = V_T \ln(I_3/I_4)$$

Equation 12:
$$\Delta I_{O3} = I\text{ref} \frac{I_3 - I_4}{I_3 + I_4} = I\text{ref} \frac{Ia + Ib - Oc}{Ia + Ib + Oc}$$

The differential input current $\Delta I06$ applied to the Common Base Pair 44 is set forth in Equations 13 and 14.

Equation 13:
$$\Delta I_{O6} = \Delta I_{O3} = I\text{ref} \frac{Ia + Ib - Oc}{Ia + Ib + Oc} = I_{12} - I_{13}$$

Equation 14:
$$I\text{ref} = I_{12} + I_{13}$$

The current output (i.e., the Channel Gain control signal received at termination Gc) (I11) will be the same as its current input I10.

Equation 15:
$$Gc \text{ (Channel Gain control signal)} = I_{11} = I_{10}$$

The differential current ($\Delta I04$) applied to the collectors of the Emitter Coupled Pair 45 will be as set forth in Equation 16.

Equation 16:
$$\Delta I_{O4} = \frac{I_{12} - I_{13}}{I_{12} + I_{13}} Gc = \frac{\Delta I_{O6}}{I\text{ref}} Gc = Gc \frac{Ia + Ib - Oc}{Ia + Ib + Oc}$$

Therefore, the differential current ($\Delta I07$) applied to the input terminals of the Cascode network 46 is:

Equation 17:
$$\Delta I_{07} = \Delta I_{04} + \Delta I_{06} = (Gc + Iref)\frac{Ia + Ib - Oc}{Ia + Ib + Oc}$$

Therefore, the differential output current appearing at the RF signal output terminals Ca and Cb is:

Equation 18:
$$Ca - Cb \text{ (RF signal)} = \Delta I_{05} = K_2(Gc + Iref)\frac{Ia + Ib - Oc}{Ia + Ib + Oc} =$$
$$K_2(1 + G_{cab})\frac{Ia + Ib - Oc}{Ia + Ib + Oc}$$

where Gcab represents the normalized gain factor for Gc and Iref.

As with the Emitter Coupled Pair functional block 31, it will be understood by those skilled in the art that the Emitter Coupled Pair functional blocks 42 and 45 could also be replaced by a single functional emitter coupled pair functional block if the Common Base Pair block 44 were to be replaced by an appropriate biasing circuit. Alternatively, the Emitter Coupled Pair functional blocks 42 and 45 can each or both, represent one or a plurality of cascade-connected emitter coupled pairs of transistors, providing the same functional results. The number of such pairs used is generally dictated by the current handling requirements imposed on the circuit by the application in which it is to be used.

Referring to FIG. 2, the sensed input current signals from the photodetectors 24 and applied to the input terminals Ja and Jb are designated respectively as I14 and I15.

Equation 19:
$$I_{14} = \text{Current Into } Ja \text{ Terminal}$$
Equation 20:
$$I_{15} = \text{Current Into } Jb \text{ Terminal}$$

The output current from the Common Base Pair 50 is the sum of its input currents, as shown in Equation 21.

Equation 21:
$$I_{16} = I_{14} + I_{15}$$

The output current signal from the Current Mirror 52, represented by I17 is the same as current signal I16, providing a sum output signal at the Ps summing output terminal equal to the sum of the input currents received from the photodetector (see Equations 22 and 23).

Equation 22:
$$I_{17} = I_{16}$$
Equation 23:
$$Ps \text{ (Position Sum)} = I_{17} = Ja + Jb \text{ (Terminal Currents)}$$

The differential input signal $\Delta V4$ applied to the input terminals of the Emitter Coupled Pair 51 is represented by Equation 24.

Equation 24:
$$\Delta V_4 = VT \ln (I_{14}/I_{15})$$

The input current signal I19 applied to the Emitter Coupled Pair 51 is the same as the Position Gain control signal I18 applied to the Gj control terminal.

Equation 25:
$$I_{19} = I_{18} = \text{Signal at } Gj \text{ Terminal}$$

The differential output current produced by the Emitter Coupled Pair 51 ($\Delta I08$) and subsequently applied by means of the Cascode 54 network to the supplemental differential output current terminals Oa and Ob is developed in Equations 26 and 27.

Equation 26:
$$\Delta I_{08} = I_{19}\frac{I_{14} - I_{15}}{I_{14} + I_{15}} = Gj\frac{Ja - Jb}{Ja + Jb} \text{ (Terminal Notation)}$$

Equation 27:
$$Oa - Ob \text{ (Supplemental Current Output)} = GjK_1\frac{Ja - Jb}{Ja + Jb}$$

As discussed previously with respect to the other Emitter Coupled Pair networks of FIG. 1, the Emitter Coupled Pair functional block 51 can represent a single emitter coupled pair of transistors or a plurality of such emitter coupled transistor pairs connected in cascade configuration.

As will be appreciated from the above equations, the three differential current output signals provided by the amplifier design of this invention, as set forth in Equations 10, 18, and 27, all represent normalized signals that are inversely proportional to the sum of the current signals applied by the photodetector sensors to the respective input terminals of the amplifier circuitry. This unique feature, coupled with the excellent DC accuracy and wideband signal handling capabilities of the amplifier circuitry yield a circuit configuration having very fast overload recovery, with virtually negligible overload levels being applied to downstream amplifier and filter circuitry.

As illustrated above, when used in an optical disk drive application, the input signal received from the photodetector sensors is amplified and separated into analog "RF" output and "Focus Error" output signals (i.e., Da - Db and Ca - Cb signals respectively). The supplementary channel portion of the circuit, illustrated in FIG. 2, acts similarly to those portions of the circuit which develop the "Focus Error" signal and is typically used for servicing those types of optical disk drive heads that use a separate photodetector input signal for developing the Focus Error signal. It can also be used to provide input to a "Position Error" function if such a transducer is present on the optical disk drive head.

As briefly discussed above, one of the primary problems associated with preamplifier circuits in optical disk drive circuits is their relative inability to handle overload input signals received by the "read" sensors during a laser writing process, wherein the laser power detected by the photodetector sensors typically exceeds ten times the "read" signal level. In sampled-servo systems, the preamplifier must recover from the overload condition before the sampling time in order to read the next usable servo timing signal from the rotating optical disk. This time period in a typical drive is approximately 100 nanoseconds. Therefore, all of the networks within the preamplifier must be configured in a way so as to handle such large overload conditions in a rapid and clean manner. The amplifier of this invention displays excellent overload characteristics since the circuitry is configured in a manner such that transistors within the amplifier do not saturate during an overload condition. In addition, the circuitry is very DC competent and does not require coupling capacitors having time constants requiring long recovery times.

When the amplifier circuitry of the present invention is used as a preamplifier in an optical disk drive system, the Da, Db signal outputs are typically connected as "Focus Error" control signal output terminals. The differential output signal from these terminals must be proportional to the difference of the detected input current signals (i.e., Ia−Ib) and must have excellent DC accuracy since any inaccuracy in this signal will directly result in an out-of-focus condition. The DC accuracy or competency of a circuit is typically specified in terms of "input offset current," which is the amount of current difference driven into the two inputs (Ia, Ib) which will cause no offset at the output (Da, Db). In an ideal amplifier, this value should be zero. In testing of prototypes of a preamplifier constructed according to the principles of this invention, the input offset current has always been less than the measurement capability of the test equipment, or less than one percent.

With the present invention, the Focus Error signal is also "normalized" by the sum of the input current signals received from the photodetector sensors. Such normalization allows the servo system in which the amplifier is installed to operate over a wide range of disk reflectivities and laser power levels. In addition to such normalization, it is desirable in a preamplifier circuit for an optical disk drive system to be able to vary the gain level through a gain control input, which is provided in the preferred embodiment by the focus gain input terminal Gi. The primary requirement for this portion of the circuitry is DC accuracy; however, the circuitry providing the Da, Db signal output also displays excellent wideband response (on the order of 100 MHz). The wideband response is important in allowing the signal to rapidly respond, and normalize, to different input levels, in aiding quick overload recovery, and in allowing very short sampling window (i.e., Servo Byte time) so that it can effectively accurately measure the focus error. The result is set forth in Equation 10. It will be understood by those skilled in the art that when the preamplifier circuits of this invention are operatively connected to input photodiodes such as in an optical disk head application, the input capacitance of the photodiodes and the input impedance significantly drops the effective bandwidth of the amplifier as used in such application to about the 20–30 MHz range.

With regard to that portion of the amplifier circuitry which develops the differential output signal at the Ca, Cb terminals, when used in an optical disk drive system as above described, such outputs are typically referred to as the "RF signal" outputs. The requirements for the RF signal are that such signal must be proportional to the sum of the input signals applied to the Ia, Ib input terminals as well as being a wideband signal. In the preferred embodiment of the circuit disclosed, the wideband signal handling capability of the circuit is on the order of DC to 30 MHz. The gain of the RF signal producing portion of the circuitry should also preferably be adjustable, which is provided in the preferred embodiment, by the Oc channel offset input control terminal. As with the "Focus Error" portion of the circuitry, the RF signal generation circuitry must have fast overload recovery. This is accomplished by the present invention by setting the channel offset input signal equal to the sum of the input current signals from the photodetector sensors so as to get small-signal amplification about that point and significant gain reduction when the sum of the input current signals is much greater than the channel offset (Oc) input control signal. While the primary requirement of this portion of preamplifier network is wideband response, DC accuracy is also important. As with the Focus Error portion of the circuitry, the input offset parameter for the RF signal generating portion of the amplifier is also less than one percent with the circuit configuration described. The result is set forth in Equation 18.

It will be appreciated by those skilled in the art that the circuit configurations described "automatically" normalize the received signals from the photodetectors without requiring complicated automatic gain control feedback loop circuitry and without dependance upon filter circuits or portions of the remotely located primary amplifier control circuits.

While the present invention has been described with respect to its application as illustrated in the preferred embodiment, it will be understood that a number of variations of the embodiment and its applications for use with photodetector signals in varied applications, are possible. For example, those skilled in the art will readily recognize that the Common Base Pair 44 could be replaced by an Inverted npn Common Base Pair and the npn Emitter Coupled Pair 42 replaced by a pnp Emitter Coupled Pair, without changing the nature of the differential current output signals. It will also be readily understood by those skilled in the art that as many emitter coupled pair stages (such as 31 or 42 and 45) as are needed to provide the requisite gain needed by a particular application can be arranged in cascaded configuration between the common base input functional block and the output terminals, in order to satisfy the application requirements. Other such modifications of the preferred embodiment and its applicability will become apparent to those skilled in the art, in light of the foregoing description. This description is intended to provide a specific example of an embodiment which clearly discloses the operation of the present invention. Accordingly, the invention is not limited to the described embodiment, or to the use of specific components, materials or parameters described herein. All alternative modifications and variations of the present invention which fall within the broad scope of the appended claims are covered.

I claim:

1. A preamplifier circuit for amplifying pairs of photodetected current signals, comprising:
(a) first and second input terminals suitable for receiving first and second input current signals from photodetector sensors;
(b) emitter coupled transistor circuit means having at least one pair of transistors arranged in emitter-coupled configuration with their bases operatively connected to said first and said second input terminals respectively for receiving said first and said second input current signals therefrom;
(c) a first control input terminal suitable for receiving a first control current signal;
(d) first current source means operatively connected to said first control input terminal and to the emitters of said emitter coupled pair of transistors for providing a current source for said emitter coupled pair responsive to said first control current signal applied to said first control input terminal;

(e) common base connected circuit means having a second pair of transistors operatively connected in common base configuration, the emitters of said second pair of transistors being operatively connected to said first and said second input terminals for receiving said first and said second input current signals therefrom;

(f) second current source means operatively connected to the collectors of said pair of common base connected transistors, wherein the output current of said second current source equals the sum of said first and said second input current signals applied to said first and said second input terminals;

(g) first and second current output terminals; and (h) output circuit means operatively connected with the collectors of said emitter coupled pair of transistors and with said first and said second output terminals, for respectively providing normalized differential output current signals to said first and said second output terminals, said differential output current between said first and said second output terminals being proportional to said first control current signal and to the difference of said first and said second input current signals and inversely proportional to their sum.

2. The preamplifier circuit as recited in claim 1, wherein said preamplifier automatically provides said normalized differential output current signal to said first and said second output terminals within a bandwidth response range from about 0 to 100 MHz.

3. The preamplifier circuit as recited in claim 2, wherein the input offset current parameter of said preamplifier is less than or equal to one percent.

4. The preamplifier circuit as recited in claim 1, wherein said preamplifier is capable of handling large overload input signals of over ten or more times that for which the preamplifier circuit is normally designed to operate, and to recover from said overload condition within less than or equal to 100 nanoseconds following receipt of the overload condition.

5. The preamplifier circuit as recited in claim 4, wherein said preamplifier is capable of handling large overload input signals of over ten or more times that for which the preamplifier circuit is normally designed to operate, and to recover from said overload condition within less than or equal to 70 nanoseconds following receipt of the overload condition.

6. The preamplifier circuit as recited in claim 1, wherein said first current source means includes a current mirror circuit having current input and output terminals, said current input terminal of the current mirror circuit being operatively connected to the emitters of said emitter coupled pair of transistors and said current output terminal being connected to said first control input terminal to receive said first control current signal.

7. The preamplifier circuit as recited in claim 1, wherein all of the recited components are configured in a single integrated circuit.

8. The preamplifier circuit as recited in claim 1, further including a summing output terminal and wherein said second current source means is operatively connected to said summing output terminal to provide an analog current output signal equal to the sum of the first and second input current signals applied to said first and second input terminals.

9. The preamplifier circuit as recited in claim 1, wherein said emitter coupled transistor circuit means includes a plurality of said emitter coupled transistor pairs respectively connected in cascade configuration from first to last emitter coupled transistor pairs, wherein the bases of the first of such emitter coupled transistor pairs are operatively respectively connected to said first and said second input terminals, the emitters of said plurality of emitter coupled transistor pairs are operatively connected to said first current source means, and the collectors of the last emitter coupled transistor pair are respectively operatively connected through said output circuit means to provide said normalized output current signal to said first and said second output terminals.

10. The preamplifier circuit as recited in claim 1, further including:

(a) a second control input terminal suitable for receiving a second control current signal;

(b) a second emitter coupled transistor circuit means having a third pair of transistors arranged in emitter-coupled configuration having a positive polarity designated one of its input bases operatively connected to receive said second control current signal and a negative polarity designated one of its input bases operatively connected to the collectors of said second pair of transistors;

(c) wherein said second current source means includes a second common base connected circuit means having a fourth pair of transistors operatively connected in common base configuration, one of the emitters of said fourth transistor pair being connected to the collectors of said second pair of transistors and the other emitter of said fourth transistor pair being operatively connected to receive said second control current signal;

(d) a third current source means operatively connected to the collectors of said fourth pair of transistors;

(e) a fourth current source operatively connected to the emitters of the third pair of transistors;

(f) a third emitter coupled transistor circuit means having a fifth pair of transistors arranged in emitter-coupled configuration with their bases respectively operatively connected to the collectors of said third pair of transistors;

(g) a third control input terminal suitable for receiving a third control current signal;

(h) circuit means operatively connecting said third control input terminal with the emitters of said fifth pair of transistors;

(i) a third common base connected circuit means having a sixth pair of transistors operatively connected in common base configuration, the emitters of said sixth pair of transistors being respectively operatively connected to the collectors of said third pair of transistors, and the collectors of said sixth pair of transistors being operatively connected to the collectors of said fifth pair of transistors;

(j) third and fourth output current terminals; and (k) second output circuit means operatively connected with the collectors of said fifth pair of transistors and with said third and fourth current output terminals, for respectively providing normalized differential output current signals to said third and said fourth output terminals, said differential output current between said third and said fourth output terminals being proportional to said third control input signal and to the difference of the sum of the first and second input current signals minus the second input current control signal and inversely proportional to the sum of the first and second input current signals minus the second input current control signal.

11. The preamplifier circuit as recited in claim 10, wherein said preamplifier automatically provides said second normalized differential output current signal to said third and said fourth output terminals within a bandwidth response range from about 0 to 100 MHz.

12. The preamplifier circuit as recited in claim 11, wherein said preamplifier automatically provides said second normalized differential output current signal to said third and said fourth output terminals within a bandwidth response range from about 0 to 30 MHz.

13. The preamplifier circuit as recited in claim 10, wherein the input offset current parameter of said preamplifier is less than or equal to one percent.

14. The preamplifier circuit as recited in claim 10, wherein said preamplifier is capable of handling large overload input signals of over ten or more times that for which the preamplifier circuit is normally designed to operate, and to recover from said overload condition within less than or equal to 100 nanoseconds following receipt of the overload condition.

15. The preamplifier circuit as recited in claim 10, wherein all of the recited components are configured in a single integrated circuit.

16. The preamplifier circuit as recited in claim 10, wherein said third emitter coupled transistor circuit means includes a plurality of said emitter coupled transistor pairs respectively connected in cascade configuration from first to last emitter coupled transistor pairs, wherein the bases of the first of such emitter coupled transistor pairs are operatively respectively connected to the collectors of said third pair of transistors, the emitters of said plurality of emitter coupled transistor pairs of the third emitter coupled transistor circuit means are connected with said third control input terminal, and the collectors of the last of said plurality of emitter coupled transistor pairs are respectively operatively connected to said collectors of said sixth pair of transistors and to said second output circuit means to provide said normalized differential output signals to said third and said fourth current output terminals.

17. A preamplifier circuit for amplifying pairs of photodetected current signals, comprising:
(a) first and second input terminals suitable for receiving first and second input current signals from photodetector sensors;
(b) first emitter coupled transistor circuit means having at least a first pair of transistors arranged in emitter-coupled configuration with their bases operatively connected to said first and said second input terminals respectively for receiving said first and said second input current signals therefrom;
(c) a first control input terminal suitable for receiving a first control current signal;
(d) first current source means operatively connected to said first control input terminal and to the emitters of said emitter coupled pair of transistors for providing a current source for said emitter coupled pair responsive to said first control current signal applied to said first control input terminal;
(e) a first common base connected circuit means having a second pair of transistors operatively connected in common base configuration, the emitters of said second pair of transistors being operatively connected to said first and said second input terminals for receiving said first and said second input current signals therefrom;
(f) second current source means operatively connected to the collectors of said pair of common base connected transistors, wherein the output current of said second current source equals the sum of said first and said second input current signals applied to said first and said second input terminals;
(g) first and second current output terminals;
(h) output circuit means operatively connected with the collectors of said emitter coupled pair of transistors and with said first and said second output terminals, for respectively providing normalized differential output current signals to said first and said second output terminals, said differential output current between said first and said second output terminals being proportional to said first control current signal and to the difference of said first and said second input current signals and inversely proportional to their sum.
(i) a second control input terminal suitable for receiving a second input control current signal;
(j) a second emitter coupled transistor circuit means having a third pair of transistors arranged in emitter-coupled configuration having a positive polarity designated one of its input bases operatively connected to receive said second control current signal and a negative polarity designated one of its input bases operatively connected to the collectors of said second pair of transistors;
(k) said second current source means includes a second common base connected circuit means having a fourth pair of transistors operatively connected in common base configuration, one of the emitters of said fourth transistor pair being connected to the collectors of said second pair of transistors and the other emitter of said fourth transistor pair being connected to receive said second input control current signal;
(l) a third current source means operatively connected to the collectors of said fourth pair of transistors;
(m) a third control input terminal suitable for receiving a third control current signal;
(n) circuit means operatively connecting said third control input terminal with the emitters of said third pair of transistors;
(o) third and fourth output current terminals; and
(p) second output circuit means operatively connected with the collectors of said third pair of transistors and with said third and fourth current output terminals, for respectively providing normalized differential output current signals to said third and said fourth output terminals, said differential output current between said third and said fourth output terminals being proportional to said third control input signal and to the difference of the sum of the first and second input current signals minus the second input current control signal and inversely proportional to the sum of the first and second input current signals minus the second input current control signal.

18. The preamplifier circuit as recited in claim 17, wherein said preamplifier automatically provides said second normalized differential output current signal to said third and said fourth output terminals within a bandwidth response range from about 0 to 100 MHz.

19. The preamplifier circuit as recited in claim 18, wherein said preamplifier automatically provides said second normalized differential output current signal to said third and said fourth output terminals within a bandwidth response range from about 0 to 30 MHz.

20. The preamplifier circuit as recited in claim 17, wherein the input offset current parameter of said preamplifier is less than or equal to one percent.

21. The preamplifier circuit as recited in claim 17, wherein said preamplifier is capable of handling large overload input signals of over ten or more times that for which the preamplifier circuit is normally designed to operate, and to recover from said overload condition within less than or equal to 100 nanoseconds following receipt of the overload condition.

22. The preamplifier circuit as recited in claim 17, wherein all of the recited components are configured in a single integrated circuit.

23. The preamplifier circuit as recited in claim 17, wherein said second emitter coupled transistor circuit means includes a plurality of emitter coupled transistor pairs respectively connected in cascade configuration from first to last emitter coupled transistor pairs, wherein a positive polarity designated one of the input bases of the first of such emitter coupled transistor pairs is operatively connected to receive said second control current signal and a negative polarity designated one of the input bases of the first of such emitter coupled transistor pairs is operatively connected to the collectors of said second pair of transistors; wherein the emitters of said plurality of emitter coupled transistor pairs of said second emitter coupled transistor circuit means are operatively connected to said third control input terminal for receiving said third control current signal; and wherein the collectors of the last emitter coupled transistor pair of said second emitter coupled transistor circuit means are respectively operatively connected to said third and fourth output current terminals to provide said normalized differential output current signals to said third and said fourth output terminals.

24. A preamplifier circuit for amplifying pairs of photodetected current signals, comprising:
(a) first and second input terminals suitable for receiving first and second input current signals from photodetector sensors;
(b) a first common base connected circuit means having a first pair of transistors operatively connected in common base configuration, the emitters of said first pair of transistors being operatively connected to said first and said second input terminals for receiving said first and said second input current signals therefrom;
(c) a first control input terminal suitable for receiving a first input control current signal;
(d) first current source means operatively connected to the collectors of said first pair of common base connected transistors, wherein the output current of said first current source equals the sum of said first and said second input current signals applied to said first and said second input terminals; said first current source means including a second common base connected circuit means having a second pair of transistors operatively connected in common base configuration, one of the emitters of said second transistor pair being connected to the collectors of said first pair of transistors and the other emitter of said second transistor pair being connected to receive said first input control current signal;
(e) an emitter coupled transistor circuit means having a third pair of transistors arranged in emitter-coupled configuration having a positive polarity designated one of its input bases connected to receive said first input control current signal and a negative polarity designated one of its input bases operatively connected to the collectors of said first pair of transistors;
(f) a second current source means operatively connected to the collectors of said second pair of transistors;
(g) a second control input terminal suitable for receiving a second control current signal;
(h) circuit means operatively connecting said second control input terminal with the emitters of said third pair of transistors;
(i) first and second output current terminals; and
(j) output circuit means operatively connected with the collectors of said third pair of transistors and with said first and second current output terminals, for respectively providing normalized differential output current signals to said first and said second output terminals, said differential output current between said first and said second output terminals being proportional to said second control input signal and to the difference of the sum of the first and second input current signals minus the first input current control signal and inversely proportional to the sum of the first and second input current signals minus the first input current control signal.

25. The preamplifier circuit as recited in claim 24, wherein said preamplifier automatically provides said second normalized differential output current signal to said third and said fourth output terminals within a bandwidth response range from about 0 to 100 MHz.

26. The preamplifier circuit as recited in claim 25, wherein said preamplifier automatically provides said second normalized differential output current signal to said third and said fourth output terminals within a bandwidth response range from about 0 to 30 MHz.

27. The preamplifier circuit as recited in claim 24, wherein the input offset current parameter of said preamplifier is less than or equal to one percent.

28. The preamplifier circuit as recited in claim 24, wherein said preamplifier is capable of handling large overload input signals of over ten or more times that for which the preamplifier circuit is normally designed to operate, and to recover from said overload condition within less than or equal to 100 nanoseconds following receipt of the overload condition.

29. The preamplifier circuit as recited in claim 24, wherein all of the recited components are configured in a single integrated circuit.

30. The preamplifier circuit as recited in claim 24, further including a third output terminal and second output circuit means operatively connecting said second current source means with said third output terminal, wherein the output current signal appearing at said third output terminal equals the sum of said first and said second input current signals and said first input control signal.

31. The preamplifier circuit as recited in claim 24, wherein said emitter coupled transistor circuit means includes a plurality of emitter coupled transistor pairs respectively connected in cascade configuration from first to last emitter coupled transistor pairs, wherein a positive polarity designated one of the input base of the first of such emitter coupled transistor pairs is operatively connected to receive said first input control current signal and a negative polarity designated one of the input bases of said first such emitter coupled transistor pair is operatively connected to the collectors of said first pair of common base connected transistors;

wherein the emitters of said plurality of emitter connected transistor pairs are operatively connected to receive said second control current signal; and wherein the collectors of the last emitter coupled transistor pair are respectively operatively connected to said output circuit means for respectively providing said normalized differential output current signals to said first and said second output terminals.

32. A preamplifier circuit for amplifying pairs of photodetected current signals, comprising:
(a) first and second input terminals suitable for receiving first and second input current signals from photodetector sensors;
(b) a first common base connected circuit means having a first pair of transistors operatively connected in common base configuration, the emitters of said first pair of transistors being operatively connected to said first and said second input terminals for receiving said first and said second input current signals therefrom;
(c) a first control input terminal suitable for receiving a first input control current signal;
(d) first current source means operatively connected to the collectors of said first pair of common base connected transistors, wherein the output current of said first current source equals the sum of said first and said second input current signals applied to said first and said second input terminals; said first current source means including a second common base connected circuit means having a second pair of transistors operatively connected in common base configuration, one of the emitters of said second transistor pair being connected to the collectors of said first pair of transistors and the other emitter of said second transistor pair being operatively connected to receive said first input control current signal;
(e) a first emitter coupled transistor circuit means having a third pair of transistors arranged in emitter-coupled configuration having a positive polarity designated one of its input bases connected to receive said first input control current signal and a negative polarity designated one of its input bases operatively connected to the collectors of said first pair of transistors;
(f) a second current source means operatively connected to the collectors of said second pair of transistors;
(g) a third current source operatively connected to the emitters of the third pair of transistors;
(h) a second emitter coupled transistor circuit means having a fourth pair of transistors arranged in emitter-coupled configuration having their bases respectively operatively connected to the collectors of said third pair of transistors;
(i) a second control input terminal suitable for receiving a second control current signal;
(j) circuit means operatively connecting said second control input terminal with the emitters of said fourth pair of transistors;
(k) a third common base connected circuit means having a fifth pair of transistors operatively connected in common base configuration, the emitters of said fifth pair of transistors being respectively operatively connected to the collectors of said third pair of transistors and the collectors of said fifth pair of transistors being operatively connected to the collectors of said fourth pair of transistors;
(l) first and second output current terminals; and
(m) output circuit means operatively connected with the collectors of said fourth pair of transistors and with said first and said second current output terminals, for respectively providing normalized differential output current signals to said first and said second output terminals, said differential output current between said first and said second output terminals being proportional to said second control input signal and to the difference of the sum of the first and second input current signals minus the first input current control signal and inversely proportional to the sum of the first and second input current signals minus the first input current control signal.

33. The preamplifier circuit as recited in claim 32, wherein said preamplifier automatically provides said second normalized differential output current signal to said third and said fourth output terminals within a bandwidth response range from about 0 to 100 MHz.

34. The preamplifier circuit as recited in claim 33, wherein said preamplifier automatically provides said second normalized differential output current signal to said third and said fourth output terminals within a bandwidth response range from about 0 to 30 MHz.

35. The preamplifier circuit as recited in claim 32, wherein the input offset current parameter of said preamplifier is less than or equal to one percent.

36. The preamplifier circuit as recited in claim 32, wherein said preamplifier is capable of handling large overload input signals of over ten or more times that for which the preamplifier circuit is normally designed to operate, and to recover from said overload condition within less than or equal to 100 nanoseconds following receipt of the overload condition.

37. The preamplifier circuit as recited in claim 32, wherein all of the recited components are configured in a single integrated circuit.

38. A method of amplifying pairs of photodetected input current signals comprising the steps of:
(a) receiving a pair of input current signals from two different photodetector sensors;
(b) simultaneously applying said pair of received input current signals to input terminals of emitter coupled transistor circuit means and common base transistor circuit means;
(c) processing said pair of input current signals by the emitter coupled transistor circuit means to provide a normalized differential output current signal between first and second output terminals that is proportional to the difference of the received input signals and inversely proportional to their sum; and
(d) processing said pair of input current signals from said photodetectors by the common base transistor circuit means to provide a second output signal equal to the sum of the received input signals.

39. A method as recited in claim 38, further including:
(a) receiving a first control input current signal; and
(b) varying the gain of said emitter controlled transistor circuit means with said first control input current signal; wherein said differential output current signal is directly proportional to said first control input signal.

40. A method as recited in claim 39, further including:
(a) receiving a second input control signal; and
(b) processing said second input control signal and said second output signal to provide a third output control signal equal to the sum of the received input current signals from said photodetectors and said second input current signal.

41. The method as recited in claim 39, further including:

(a) receiving a second input control signal;
(b) simultaneously applying said second output signal and said second input control signal to input terminals of a second emitter coupled transistor circuit means and a second common base transistor circuit means;
(c) processing said second output signal and said second input control signal by said second emitter coupled transistor circuit means to provide a second normalized differential output current signal between third and fourth output terminals that is proportional to the sum of said input current signals from the photodetectors minus the second control signal and is inversely proportional to the sum of said input current signals from the photodetector and said second control signal; and
(d) processing said second output signal and said second input control signal by the second common base transistor circuit means to provide a fourth output signal equal to the sum of the received input signals from the photodetector and the second input control signal.

42. The method as recited in claim 41, further including:
(a) receiving a third input control signal; and
(b) varying the gain of said second emitter coupled transistor circuit means with said third input control signal; wherein said second differential output current signal is directly proportional to said third input control signal.

43. A method of amplifying pairs of photodetected input current signals, comprising:

(a) receiving a pair of input current signals from two different photodetector sensors;
(b) processing said pair of received input current signals from said photodetectors by means of a first common base transistor circuit means to provide a first summation signal equal to the sum of said received input current signals;
(c) receiving a first control input signal;
(d) simultaneously applying said first summation signal and said first control signal to input terminals of an emitter coupled transistor circuit means and a second common base transistor circuit means;
(e) processing said first summation signal and said first control signal by the emitter coupled transistor circuit means to provide a normalized differential output current signal between first and second output terminals that is proportional to the difference of the first summation signal and the first control signal and inversely proportional to their sum; and
(f) processing said first summation signal and said first control signal by the second common base transistor circuit means to provide a second summation signal equal to the sum of the first summation signal and the first input control signal.

44. The method as recited in claim 43, further including:
(a) receiving a second control input current signal; and
(b) varying the gain of said emitter coupled transistor circuit means with said second control input current signal; wherein said differential output current signal is directly proportional to said second input control signal.

* * * * *

UNITED STATES PATENT AND TRADEMARK OFFICE
CERTIFICATE OF CORRECTION

PATENT NO.  : 5,254,957
DATED       : October 19, 1993
INVENTOR(S) : James H. Lauffenburger It is certified that error appears in the above-identified patent and that said Letters Patent is hereby corrected as shown below:

Column 1, Line 7, delete "continuation-in-part" after the letter "a".

Column 1, Lines 8 and 10, delete "division" after the word "continuation".

Signed and Sealed this

Thirty-first Day of May, 1994

Attest:

BRUCE LEHMAN

Attesting Officer          Commissioner of Patents and Trademarks